United States Patent
Li et al.

(10) Patent No.: US 8,003,417 B2
(45) Date of Patent: Aug. 23, 2011

(54) ORGANIC ELECTROLUMINESCENT DISPLAY DEVICE AND METHOD OF MANUFACTURING THE SAME

(75) Inventors: Fengjin Li, Gumi-si (KR); Jaeyoung Lee, Chilgok-gun (KR); Taeyeon Yoo, Chilgok-gun (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/608,648

(22) Filed: Oct. 29, 2009

(65) Prior Publication Data
US 2010/0283071 A1 Nov. 11, 2010

(30) Foreign Application Priority Data
May 6, 2009 (KR) .................. 10-2009-0039313

(51) Int. Cl.
*H01L 51/52* (2006.01)

(52) U.S. Cl. ............... 438/29; 438/69; 438/99; 257/98; 257/E51.018; 257/E33.061; 257/E25.009; 257/E25.008; 257/E51.052

(58) Field of Classification Search .............. 438/29, 438/69, 99; 257/98, E51.018, E33.061, E25.009, 257/E25.008, E51.052
See application file for complete search history.

(56) References Cited

U.S. PATENT DOCUMENTS
2007/0200488 A1* 8/2007 Ito .................... 313/500
2007/0241671 A1* 10/2007 Kai et al. ............ 313/504
* cited by examiner

*Primary Examiner* — Wael M Fahmy
*Assistant Examiner* — Marc Armand
(74) *Attorney, Agent, or Firm* — Birch, Stewart, Kolasch & Birch, LLP

(57) ABSTRACT

A method of manufacturing an organic electroluminescent display device may comprise forming transistors on a substrate, forming a lower electrode over an insulating layer, forming an insulating layer on the transistors, the lower electrode being coupled to a source or a drain of each of the transistors, forming a bank layer on the lower electrode, the bank layer having openings to expose part of the lower electrode, forming a bus electrode on the bank layer, forming an organic light-emitting layer to cover the lower electrode, the bank layer, and the bus electrode, patterning the organic light-emitting layer using a laser, thereby exposing the bus electrode placed on the bank layer, and forming an upper electrode on the organic light-emitting layer so that the upper electrode comes into contact with the exposed bus electrode.

6 Claims, 13 Drawing Sheets

ORGANIC ELECTROLUMINESCENT DISPLAY DEVICE AND METHOD OF MANUFACTURING THE SAME

This application claims the benefit of Korean Patent Application No. 10-2009-0039313 filed on May 6, 2009, which is hereby incorporated by reference.

BACKGROUND

1. Field

This document relates to an organic electroluminescent display device and a method of manufacturing the same.

2. Related Art

An organic electroluminescent device used in an organic electroluminescent display device is an emissive device in which an emission layer is formed between two electrodes disposed on a substrate. The organic electroluminescent display device operates according to a top-emission method, a bottom-emission method, or a dual-emission method according to the direction in which light is emitted. The organic electroluminescent display device is divided into a passive matrix type and an active matrix type according to its driving method.

Each of subpixels arranged in the organic electroluminescent display device comprises a transistor unit, a lower electrode, and an organic light-emitting diode. The transistor unit comprises a switching transistor, a driving transistor, and a capacitor. The lower electrode is coupled to the driving transistor included in the transistor unit. The organic light-emitting diode comprises an organic light-emitting layer and an upper electrode. In this organic electroluminescent display device, when a scan signal, a data signal, power, etc. are supplied to the plurality of subpixels arranged in a matrix, selected subpixels emit light, thereby being capable of displaying an image.

Meanwhile, in the conventional organic electroluminescent display device, the resistance of electrodes formed in a panel is relatively high. Accordingly, when the conventional organic electroluminescent display device is used to implement large-sized display devices, there are problems such as rise in driving voltage and irregularity in luminance.

SUMMARY

An aspect of this document is to provide a method of manufacturing an organic electroluminescent display device, comprising forming transistors on a substrate, forming a insulating layer in the transistors, forming a lower electrode on the insulating layer, the lower electrode being coupled to a source or a drain of each of the transistors, forming a bank layer on the lower electrode, the bank layer having openings to expose part of the lower electrode, forming a bus electrode on the bank layer, forming an organic light-emitting layer to cover the lower electrode, the bank layer, and the bus electrode, patterning the organic light-emitting layer using a laser, thereby exposing at least part of the bus electrode placed on the bank layer, and forming an upper electrode on the organic light-emitting layer so that the upper electrode comes into contact with the exposed bus electrode.

Another aspect of this document is to provide a method of manufacturing an organic electroluminescent display device, comprising forming transistors on a substrate, forming an insulating layer on the transistors, forming a lower electrode on an insulating layer, the lower electrode being coupled to a source or a drain of each of the transistors, forming a bus electrode on the insulating layer, the bus electrode being separated from the lower electrode and formed on the same layer as the lower electrode, forming a bank layer on the lower electrode and the bus electrode, the bank layer having openings to respectively expose the lower electrode and the bus electrode, forming an organic light-emitting layer to cover the lower electrode, the bus electrode, the bank layer, and the bus electrode, patterning the organic light-emitting layer using a laser, thereby exposing at least part of the bus electrode placed on the bank layer, and forming an upper electrode on the organic light-emitting layer so that the upper electrode comes into contact with the exposed bus electrode.

Yet another aspect of this document is to provide an organic electroluminescent display device, comprising transistors formed on a substrate, an insulating layer on the transistors, a lower electrode formed on the insulating layer and coupled to a source or a drain of each of the transistors, a bank layer having openings to expose part of the lower electrode, a bus electrode formed on the bank layer, an organic light-emitting layer formed to cover the lower electrode, the bank layer, and the bus electrode and patterned to expose at least part of the bus electrode, and an upper electrode formed on the organic light-emitting layer and configured to come into contact with the exposed bus electrode.

Still another aspect of this document is to provide an organic electroluminescent display device, comprising transistors formed on a substrate, an insulating layer on the transistors, a lower electrode formed on the insulating layer and coupled to a source or a drain of each of the transistors, a bus electrode formed on the same layer as the lower electrode and separated from the lower electrode, a bank layer having openings to respectively expose the lower electrode and the bus electrode, an organic light-emitting layer formed to cover the lower electrode, the bank layer, and the bus electrode and patterned to expose at least part of the bus electrode, and an upper electrode formed on the organic light-emitting layer and configured to come into contact with the exposed bus electrode.

BRIEF DESCRIPTION OF THE DRAWINGS

The accompany drawings, which are included to provide a further understanding of this document and are incorporated in and constitute a part of this specification, illustrate embodiments of this document and together with the description serve to explain the principles of this document.

DETAILED DESCRIPTION

Detailed reference will now be made to embodiments of this document, examples of which are illustrated in the accompanying drawings.

First Embodiment

Figure 1:
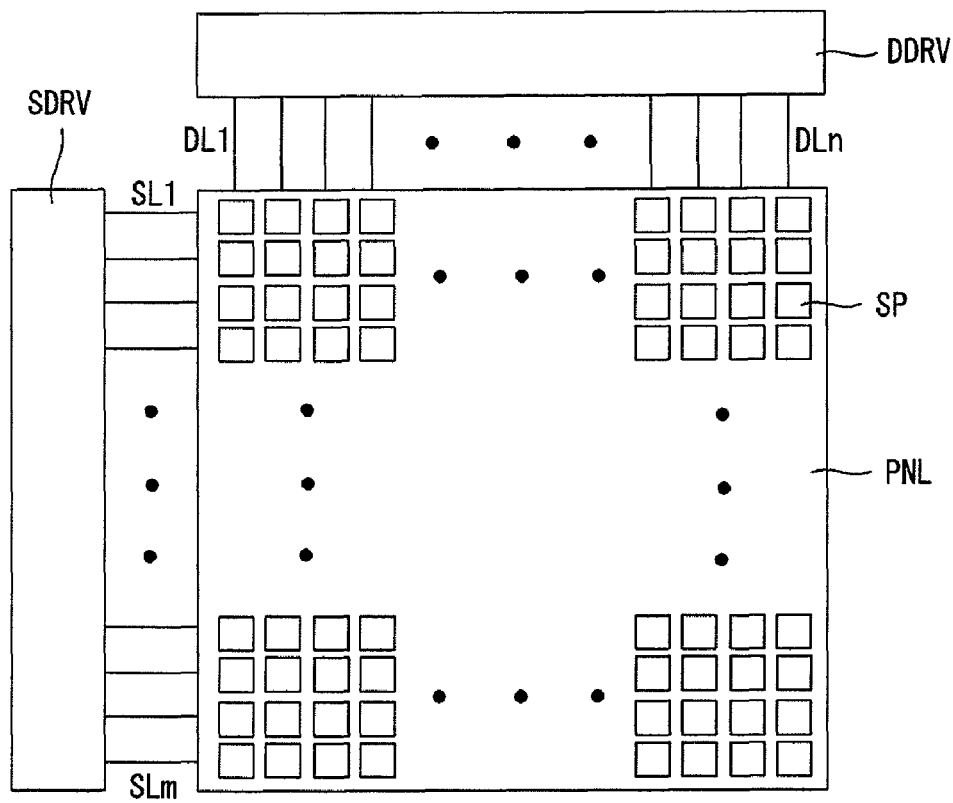
FIG. 1 is a schematic block diagram of an organic electroluminescent display device according to an embodiment of this document.
Figure 2:
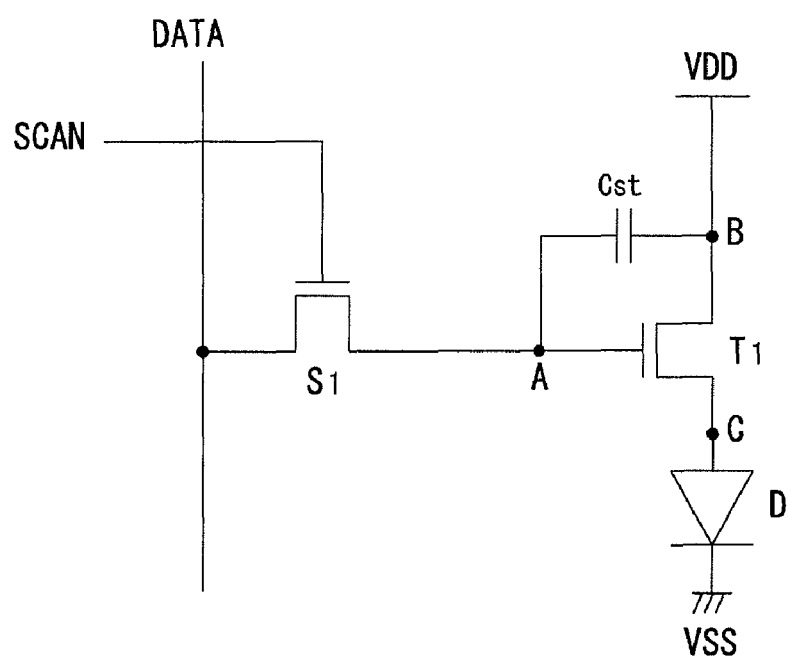
FIG. 2 is an exemplary view showing the circuit construction of a subpixel shown in FIG. 1.

Referring to FIGS. 1 and 2, an organic electroluminescent display device according to a first embodiment of this document may comprise a panel PNL comprising subpixels SP arranged in a matrix, a scan driver SDRV configured to supply the scan lines SL1, ..., SLm of the subpixels SP with scan signals, and a data driver DDRV configured to supply the data lines DL1, ..., DLn of the subpixels SP with data signals.

Each of the subpixels SP may have a 2T(Transistor)1C (Capacitor) structure, comprising a switching transistor S1, a driving transistor T1, a capacitor Cst, and an organic light-emitting diode D, or a structure in which another transistor or capacitor is further added to the 2T1C structure.

In the 2T1C structure, the elements included in the subpixel SP may be coupled together as follows. The switching transistor S1 has a gate coupled to the scan line SL1 from which a scan signal SCAN is supplied, one terminal coupled to the data line DL1 from which a data signal DATA is supplied, and the other terminal coupled to a first node A. The driving transistor T1 has a gate coupled to the first node A, one terminal coupled to a second node B and a first power source line VDD from which a high electric potential is supplied, and the other terminal coupled to a third node C. The capacitor Cst has one terminal coupled to the first node A and the other terminal coupled to the second node B. The organic light-emitting diode D has an anode coupled to the third node C and a cathode coupled to a second power source line VSS from which a low electric potential is supplied.

Although an example in which the transistors S1 and T1 included in the subpixel SP have an N-type configuration has been described above, embodiments of this document are not limited to the above example. Further, the high electric potential supplied from the first power source line VDD may be higher than the low electric potential supplied from the second power source line VSS, and the levels of power sources supplied from the first power source line VDD and the second power source line VSS may be switched according to a driving method.

The above-described subpixel SP may operate as follows. When the scan signal SCAN is supplied through the scan line SL1, the switching transistor S1 is turned on. When the data signal DATA supplied through the data line DL1 is supplied to the first node A via the turned-on switching transistor S, the data signal is stored in the capacitor Cst in the form of a data voltage. When the supply of the scan signal is stopped and the switching transistor S1 is turned off, the driving transistor T1 is driven in response to the data voltage stored in the capacitor Cst. When the high electric potential supplied through the first power source line VDD flows through the second power source line VSS, the organic light-emitting diode D emits light. It is to be noted that the above driving method is only an example, and embodiments of this document are not limited to the example.

The organic electroluminescent display device of this document may be manufactured using the following method.

Figure 3:
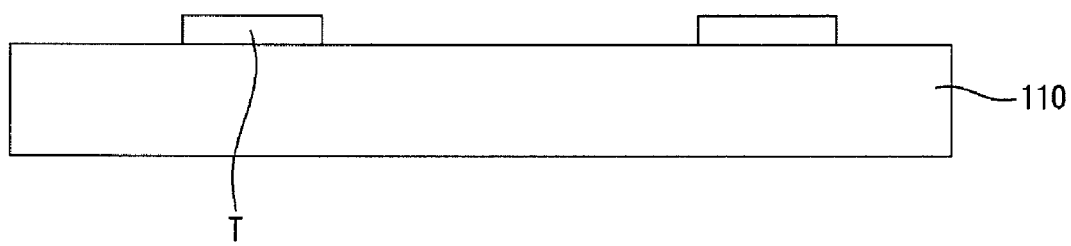
FIGS. 3 through 16 are diagrams showing a method of manufacturing the organic electroluminescent display device according to a first embodiment of this document.
Figure 4:
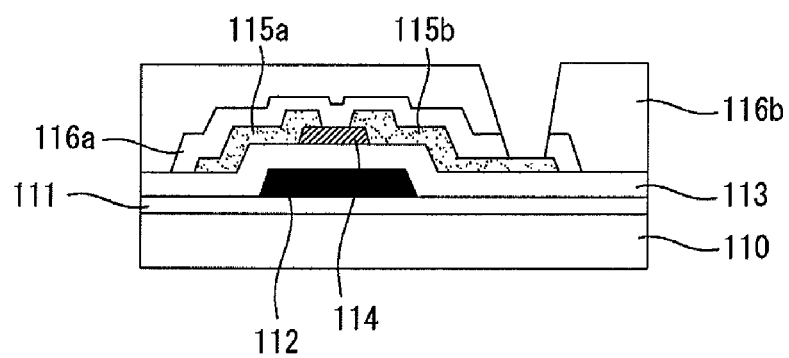

Referring to FIGS. 3 and 4, transistors T are formed on a substrate 110. The transistors T may be divided into a bottom gate-type transistor having a gate disposed on its bottom and a top gate-type transistor having a gate disposed on its top. In this embodiment, a structure of the bottom gate-type transistor is described as an example, for convenience.

The transistor T corresponds to the driving transistor included in the subpixel. The transistor T is formed on the substrate 110. The substrate 110 may be made of a material which has excellent mechanical strength or measurement stability. The substrate 110 may be made of, for example, a glass plate, a metal plate, a ceramic plate, or a plastic plate (polycarbonate resin, acrylic resin, vinyl chloride resin, polyethylene terephthalate resin, polyimide resin, polyester resin, epoxy resin, silicon resin, fluoride resin, etc.). A method of manufacturing the bottom gate-type transistor is described below.

A buffer layer 111 is formed on the substrate 110. The buffer layer 111 may be formed in order to protect a thin film transistor, formed in a subsequent process, from impurities, such as alkali ions drained from the substrate 110, and may be omitted. The buffer layer 111 may be made of silicon oxide (SiOx) or silicon nitride (SiNx).

A gate 112 is formed on the buffer layer 111. The gate 112 may be made of one selected from the group consisting of molybdenum (Mo), aluminum (Al), chrome (Cr), gold (Au), titanium (Ti), nickel (Ni), neodymium (Nd), and copper (Cu), or an alloy thereof. Further, the gate 112 may be either a single layer of one selected from the group consisting of molybdenum (Mo), aluminum (Al), chrome (Cr), gold (Au), titanium (Ti), nickel (Ni), neodymium (Nd), and copper (Cu), or a multilayer made of an alloy thereof. Alternatively, the gate 112 may be a dual layer made of Mo/Al—Nd or Mo/Al.

A first insulating layer 113 is formed on the gate 112. The first insulating layer 113 may be a single layer of silicon oxide (SiOx) or silicon nitride (SiNx), or a multilayer thereof, but is not limited thereto.

An active layer 114 is formed on the first insulating layer 113. The active layer 114 may comprise amorphous silicon or polycrystalline silicon which is crystallized amorphous silicon. Although not shown in the drawing, the active layer 114 may comprise a channel region, a source region, and a drain region. The source region and the drain region may be doped with a P-type or N-type impurity. Further, the active layer 114 may comprise an ohmic contact layer for lowering contact resistance.

A source 115a and a drain 115b are formed on the active layer 114. The source 115a and the drain 115b may be formed of a single layer or a multilayer. When the source 115a and the drain 115b are formed of a single layer, they may be made of any one selected from the group consisting of molybdenum (Mo), aluminum (Al), chrome (Cr), gold (Au), titanium (Ti), nickel (Ni), neodymium (Nd), and copper (Cu), or an alloy thereof. When the source 115a and the drain 115b are formed of a multilayer, they may be formed of a dual layer of Mo/Al—Nd or a triple layer of Mo/Al/Mo or Mo/Al—Nd/Mo.

A second insulating layer 116a is formed on the source 115a and the drain 115b. The second insulating layer 116a may be formed of a single layer of silicon oxide (SiOx) or silicon nitride (SiNx), or a multilayer thereof, but is not limited thereto. The second insulating layer 116a may be a passivation layer. A third insulating layer 116b is formed on the second insulating layer 116a. The third insulating layer 116b may be formed of a single layer of silicon oxide (SiOx) or silicon nitride (SiNx), or a multilayer thereof, but is not limited thereto. The third insulating layer 116b may be a polishing layer for increasing the degree of flatness of a surface. The above-described transistor has been illustrated to aid in understanding the exemplary embodiment, but may have a different structure according to a mask process.

Figure 5:
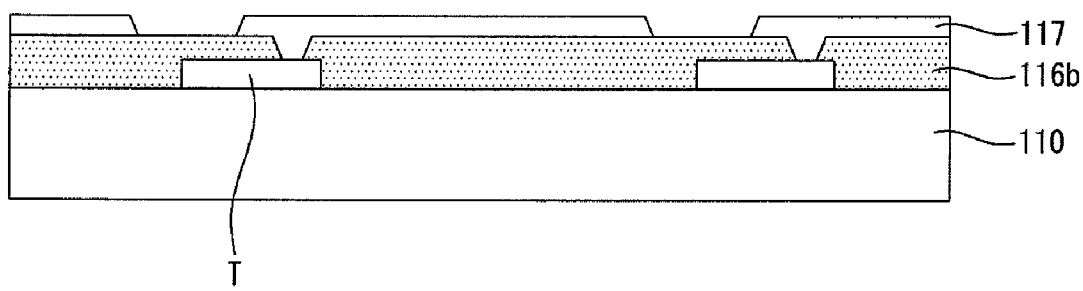

Referring to FIG. 5, a lower electrode 117 is coupled to the source 115a or the drain 115b of the transistor T. In other words, the lower electrode 117 is formed on the third insulating layer 116b so that it is coupled to the source 115a or the drain 115b of the transistor T. In this embodiment, the lower electrode 117 may be selected as an anode. The lower electrode 117 selected as an anode may be made of a transparent conductive material, such as indium tin oxide (ITO), indium zinc oxide (IZO), indium tin zinc oxide (ITZO), or $Al_2O_3$ doped ZnO (AZO), but is not limited thereto.

Figure 6:
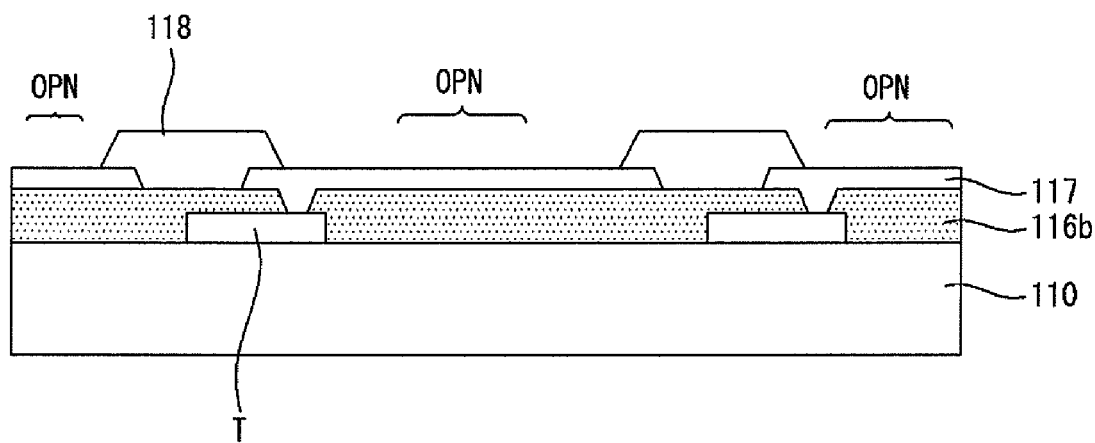

Referring to FIG. 6, a bank layer 118 is formed to have openings OPN through which part of the lower electrode 117 is exposed. The bank layer 118 may be made of an organic material, such as benzocyclobutene (BCB) resin, acrylic resin, or polyimide resin, but is not limited thereto. Since the openings OPN through which part of the lower electrode 117 is exposed are formed when the bank layer 118 is formed, the light-emitting region of the subpixel may be defined.

Figure 7:
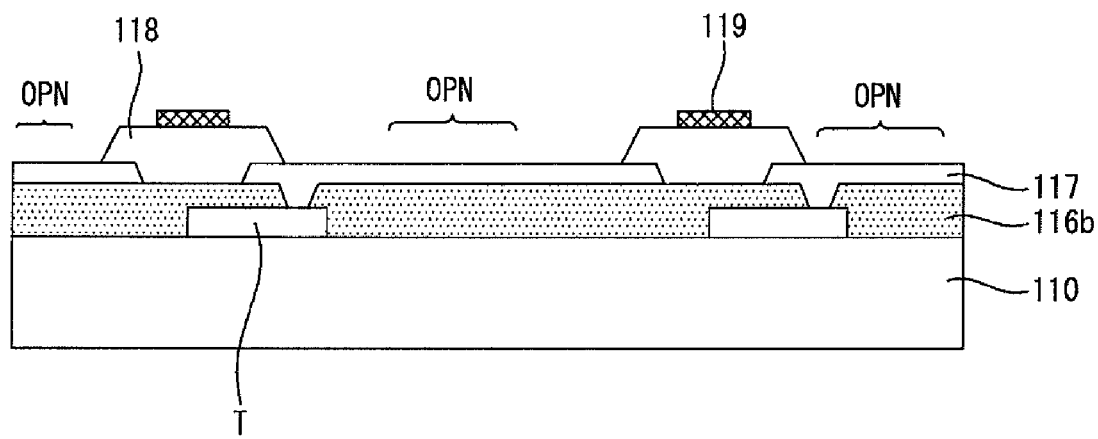
Figure 8:
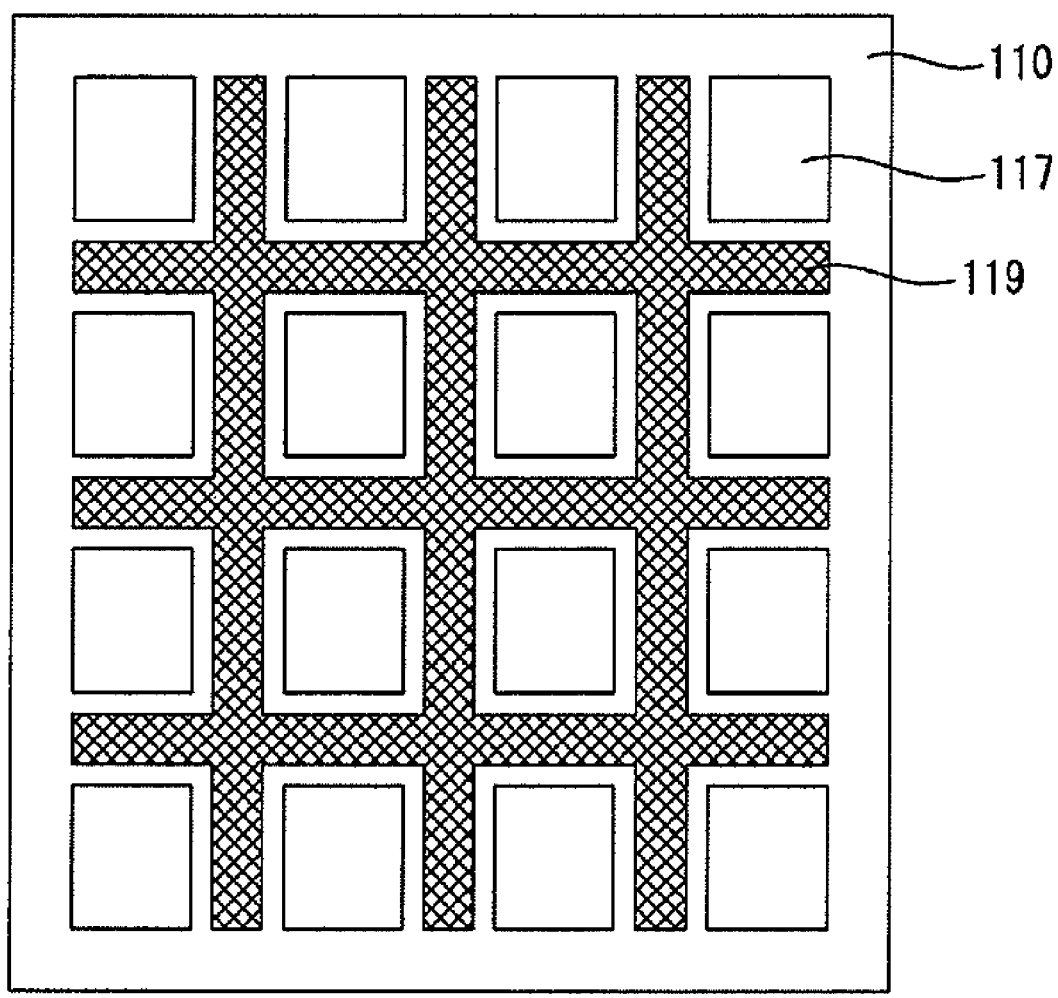
Figure 9:
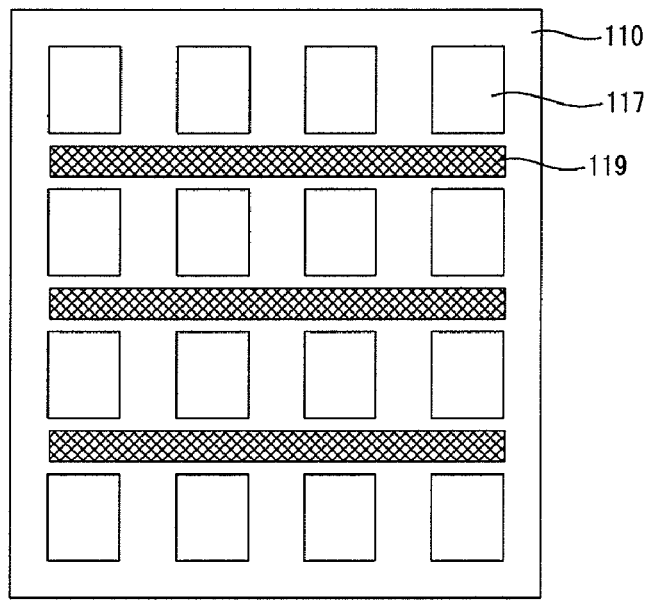
Figure 10:
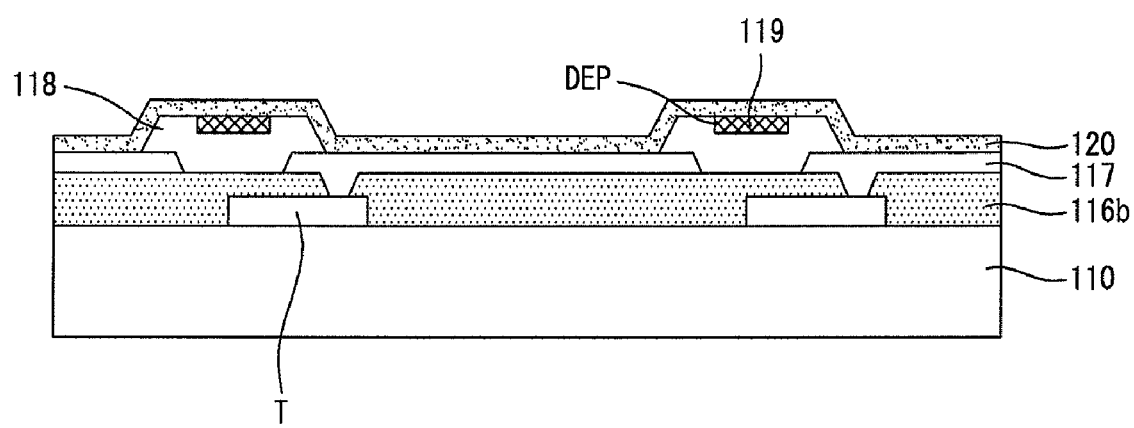

Referring to FIG. 7, a bus electrode 119 is formed on the bank layer 118. The bus electrode 119 may be made of the same material as the lower electrode 117 or different material. The bus electrode 119 may have a single layer structure or a multilayer structure made of at least one selected from among molybdenum (Mo), aluminum (Al), chrome (Cr), gold (Au), titanium (Ti), nickel (Ni), neodymium (Nd), and copper (Cu). Meanwhile, as shown in FIGS. 8 and 9, the bus electrode 119 may be formed in a mesh (refer to FIG. 8) or stripes (refer to FIG. 9), but is not limited thereto. Referring to FIG. 10, when the bus electrode 119 is formed on the bank layer 118, patterning for the bank layer 118 may be performed so that part of the bank layer 118 is depressed and the bus electrode 119 may be formed in the depressed portion DEP. In this case, since the bus electrode 119 may become thick, an electrode with low resistance can be implemented.

Figure 11:
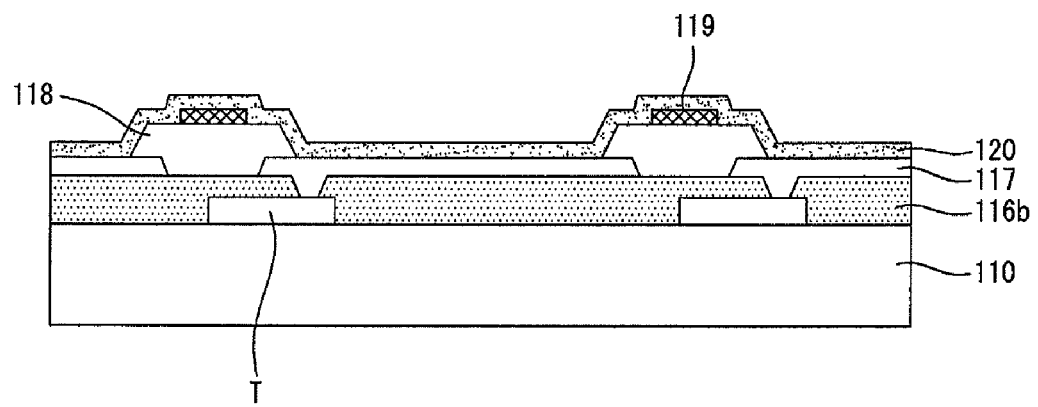
Figure 12:
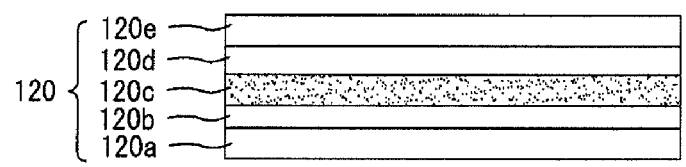

Referring to FIG. 11, an organic light-emitting layer 120 is formed to cover the lower electrode 117, the bank layer 118, and the bus electrode 119. The organic light-emitting layer 120 is formed in such a way as to cover the lower electrode 117, the bank layer 118, and the bus electrode 119 formed on the substrate 110. Referring to FIG. 12, the organic light-emitting layer 120 may comprise a hole injection layer 120a, a hole transport layer 120b, an emission layer 120c, an electron transport layer 120d, and an electron injection layer 120e. The hole injection layer 120a may function to smooth the injection of holes. The hole injection layer 120a may be made of one or more selected from the group consisting of CuPc (cupper phthalocyanine), PEDOT(poly(3,4)-ethylenedioxythiophene), PANI(polyaniline), and NPD(N,N-dinaphthyl-N,N'-diphenyl benzidine), but is not limited thereto. The hole transport layer 120b may function to smooth the injection of electrons. The hole transport layer 120b may be made of one or more selected from the group consisting of NPD(N, N-dinaphthyl-N,N'-diphenyl benzidine), TPD(N,N'-bis-(3-methylphenyl)-N,N'-bis-(phenyl)-benzidine), and s-TAD, MTDATA(4,4',4"-Tris(N-3-methylphenyl-N-phenyl-amino)-triphenylamine), but is not limited thereto. The emission layer 120c may comprise a material that emits red, green, blue, or white light and may be made of a phosphorescent or fluorescent material. In the case where the emission layer 120c is made of a material that emits red light, the emission layer 120c may be made of a phosphorescent material comprising a host materials comprising carbazole biphenyl (CBP) or 1,3-bis(carbazol-9-y1) (mCP), and a dopant comprising one or more selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP(octaethylporphyrin platinum). Alternatively, the emission layer 120c may be made of a fluorescent material comprising PBD:Eu (DBM)3(Phen) or Perylene, but is not limited thereto. In the case where the emission layer 120c is made of a material that emits green light, the emission layer 120c may be made of a phosphorescent material comprising a host material comprising CBP or mCP, and a dopant material comprising Ir(ppy)3 (fac tris(2-phenylpyridine)iridium). Alternatively, the emission layer 120c may be made of a fluorescent material comprising Alq3(tris(8-hydroxyquinolino)aluminum), but is not limited thereto. In the case where the emission layer 120c is made of a material that emits blue light, the emission layer 120c may be made of a phosphorescent material comprising a host material comprising CBP or mCP and a dopant material comprising (4,6-F2 ppy)2Irpic. Alternatively, the emission layer 120c may be made of a fluorescent material comprising any one selected from the group consisting of spiro-DPVBi, spiro-6P, distryrylbenzene (DSB), distyrylarylene (DSA), PFO polymer, and PPV polymer, but is not limited thereto. The electron transport layer 120d may function to smooth the transport of electrons. The electron transport layer 120d may be made of one or more selected from the group consisting of Alq3(tris(8-hydroxyquinolino)aluminum), PBD, TAZ, spiro-PBD, BAlq, and SAlq, but is not limited thereto. The electron injection layer 120e may function to smooth the injection of electrons. The electron injection layer 120e may be made of Alq3(tris(8-hydroxyquinolino)aluminum), PBD, TAZ, spiro-PBD, BAlq, or SAlq, but is not limited thereto. Note that this document is not limited to the above examples, and at least one of the hole injection layer 120a, the hole transport layer 120b, the electron transport layer 120d, and the electron injection layer 120e may be omitted.

Figure 13:
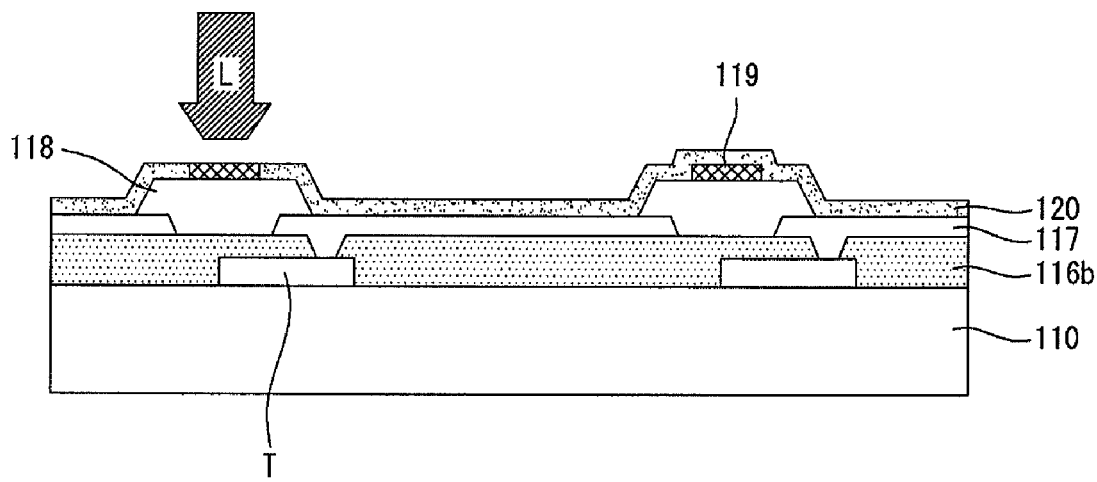
Figure 14:
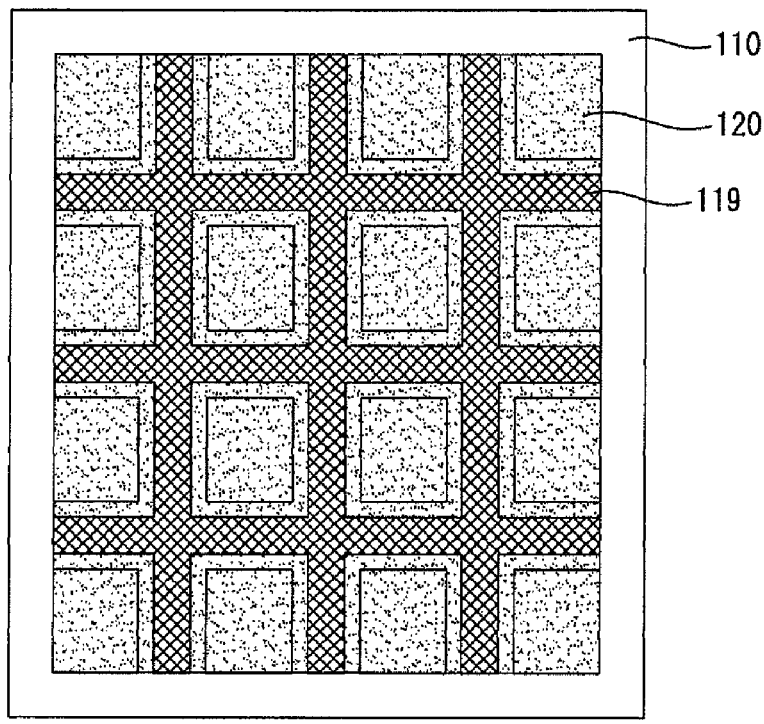
Figure 15:
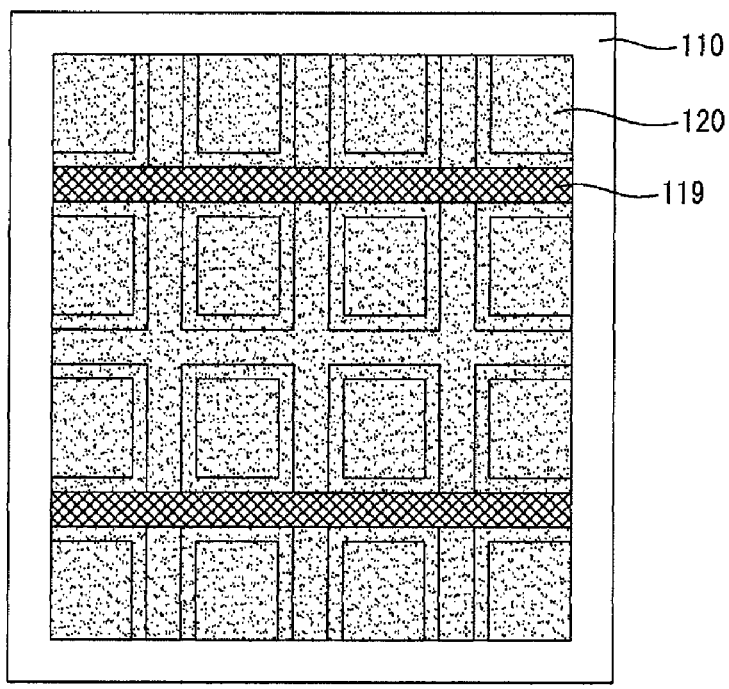

Referring to FIG. 13, the organic light-emitting layer 120 is patterned so that the bus electrode 119 formed on the bank layer 118 is exposed. The organic light-emitting layer 120 is patterned using a laser L. If the organic light-emitting layer 120 is patterned using the laser L as described above, light energy emitted from the laser L is transformed into thermal energy, so a boundary portion of the organic light-emitting layer 120 and the bus electrode 119 is sublimated. Meanwhile, when the organic light-emitting layer 120 is patterned using the laser L, a region where the bus electrode 119 is formed may be fully patterned as shown in FIG. 14, or locally patterned as shown in FIG. 15.

Figure 16:
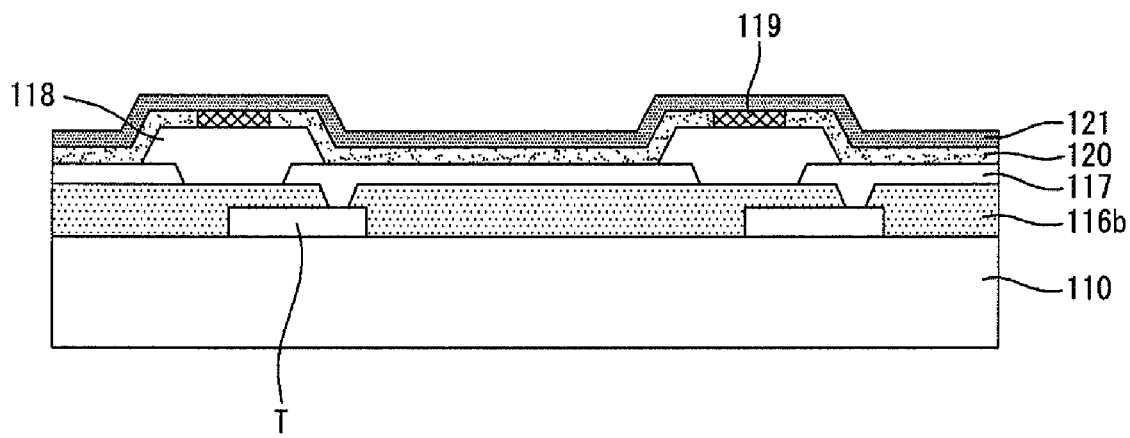

Referring to FIG. 16, an upper electrode 121 is formed on the organic light-emitting layer 120 so that the upper electrode 121 comes into contact with the exposed bus electrode 119. The upper electrode 121 may be selected as a cathode. The upper electrode 121 selected as the cathode may have a single layer or multilayer structure made of a single material, such as Al, AlNd, or Ag, or a single layer or multilayer structure made of a complex material, such as Mg:Ag or Al/Ag. Alternatively, the upper electrode 121 may have a single layer or multilayer structure made of metal oxide, such as ITO, IZO, or ITZO, or an organic conductive material, but is not limited thereto. Here, the upper electrode 121 may be made of the above-described materials, but is formed thinly in order to enhance transparency. Accordingly, the light emitted from the organic light-emitting layer 120 can travel in the direction of the upper electrode 121.

If the top emission-type organic electroluminescent display device is manufactured using the above method, the upper electrode 121 selected as a cathode in order to enhance transparency can be formed thinly. In particular, the resistance of the upper electrode 121 can be lowered because the bus electrode 119 and the upper electrode 121 formed on the bank layer 118 can be electrically coupled to each other without increasing a mask process. The organic electroluminescent display device having the above structure can lower a driving voltage and so solve the problem of luminance irregularity. Accordingly, problems (e.g., a rise in the driving voltage and luminance irregularity) occurring when a large-sized display device is implemented using an organic electroluminescent display device can be improved.

Second Embodiment

Figure 17:
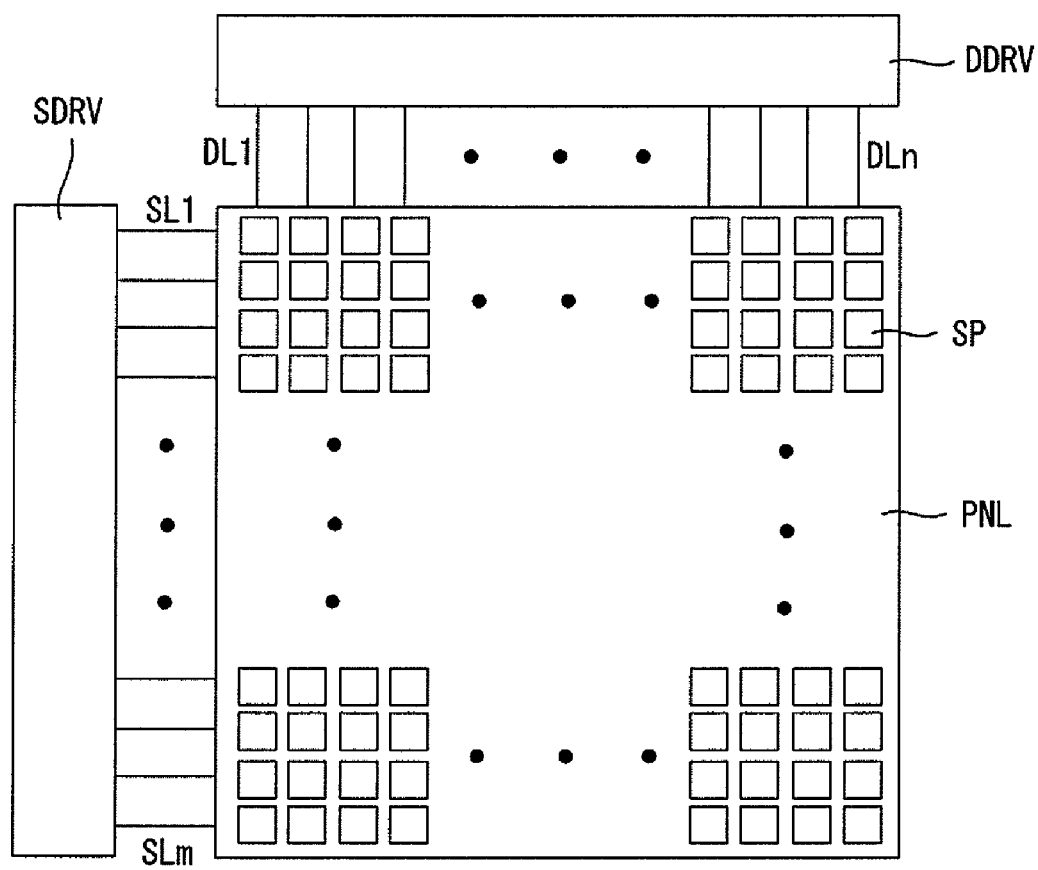
FIG. 17 is a schematic block diagram of an organic electroluminescent display device according to a second exemplary embodiment of this document.
Figure 18:
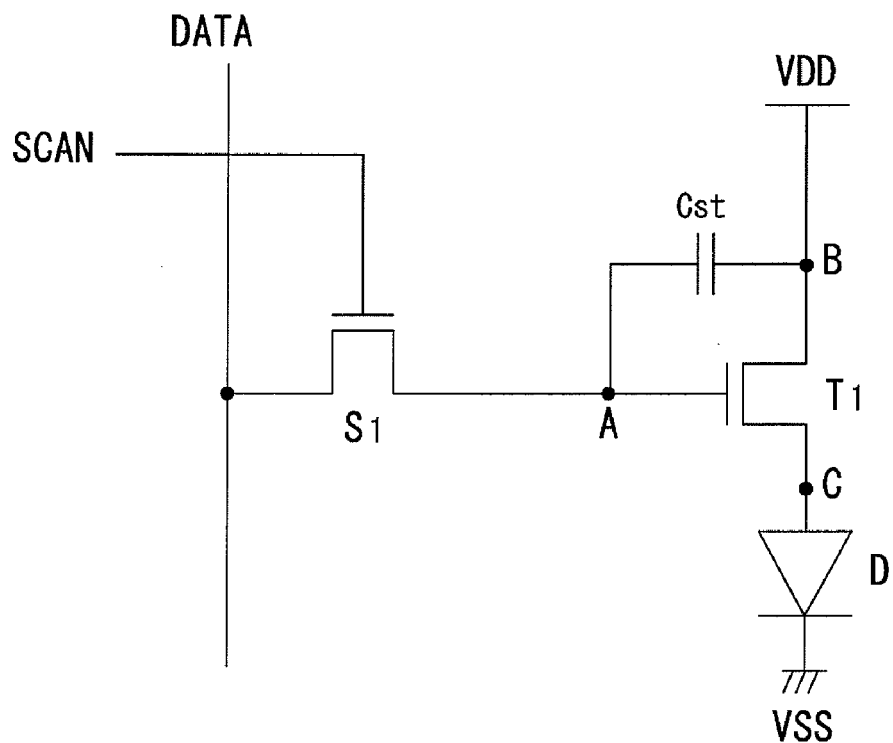
FIG. 18 is an exemplary view showing the circuit construction of a subpixel shown in FIG. 17.

Referring to FIGS. 17 and 18, an organic electroluminescent display device according to a second embodiment of this document may comprise a panel PNL comprising subpixels SP arranged in a matrix, a scan driver SDRV configured to supply the scan lines SL1, . . . , SLm of the subpixels SP with scan signals, and a data driver DDRV configured to supply the data lines DL1, . . . , DLn of the subpixels SP with data signals.

Each of the subpixels SP may have a 2T1C structure, comprising a switching transistor S1, a driving transistor T1, a capacitor Cst, and an organic light-emitting diode D, or a structure in which another transistor or capacitor is further added to the 2T1C structure.

In the 2T1C structure, the elements included in the subpixel SP may be coupled together as follows. The switching transistor S1 has a gate coupled to the scan line SL1 from which a scan signal SCAN is supplied, one terminal coupled to the data line DL1 from which a data signal DATA is supplied, and the other terminal coupled to a first node A. The driving transistor T1 has a gate coupled to the first node A, one terminal coupled to a second node B and a first power source line VDD from which a high electric potential is supplied, and the other terminal coupled to a third node C. The capacitor Cst has one terminal coupled to the first node A and the other terminal coupled to the second node B. The organic light-emitting diode D has an anode coupled to the third node C and a cathode coupled to a second power source line VSS from which a low electric potential is supplied.

Although an example in which the transistors S1 and T1 included in the subpixel SP have an N-type configuration has been described above, embodiments of this document are not limited to the above example. Further, the high electric potential supplied from the first power source line VDD may be higher than the low electric potential supplied from the second power source line VSS, and the levels of power sources supplied from the first power source line VDD and the second power source line VSS may be switched according to a driving method.

The above-described subpixel SP may operate as follows. When the scan signal SCAN is supplied through the scan line SL1, the switching transistor S1 is turned on. When the data signal DATA supplied through the data line DL1 is supplied to the first node A via the turned-on switching transistor S, the data signal is stored in the capacitor Cst in the form of a data voltage. When the supply of the scan signal is stopped and the switching transistor S1 is turned off, the driving transistor T1 is driven in response to the data voltage stored in the capacitor Cst. When the high electric potential supplied through the first power source line VDD flows through the second power source line VSS, the organic light-emitting diode D emits light. Note that the above driving method is only an example, and embodiments of this document are not limited to the example.

The organic electroluminescent display device comprising the above-described subpixel may be manufactured using the following method.

Figure 19:
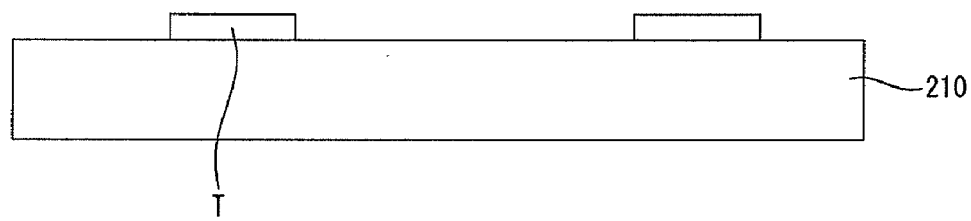
FIGS. 19 through 30 are diagrams showing a method of manufacturing the organic electroluminescent display device according to a second embodiment of this document.
Figure 20:
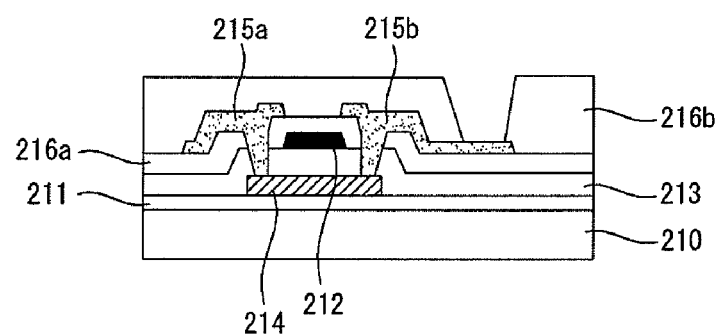

Referring to FIGS. 19 and 20, transistors T are formed on a substrate 210. The transistors T may be divided into bottom gate-type transistors having a gate disposed on their bottom and top gate-type transistors having a gate disposed on their top. In this embodiment, a structure of the top gate-type transistors is described as an example, for convenience.

The transistor T corresponds to the driving transistor included in the subpixel. The transistor T is formed on the substrate 210. The substrate 210 may be made of a material which has excellent mechanical strength or measurement stability. The substrate 210 may be made of, for example, a glass plate, a metal plate, a ceramic plate, or a plastic plate (polycarbonate resin, acrylic resin, vinyl chloride resin, polyethylene terephthalate resin, polyimide resin, polyester resin, epoxy resin, silicon resin, fluoride resin, etc.). A method of manufacturing the bottom gate-type transistor is described below.

A buffer layer 211 is formed on the substrate 210. The buffer layer 211 may be formed in order to protect a transistor, formed in a subsequent process, from impurities, such as alkali ions drained from the substrate 210, and may be omitted. The buffer layer 211 may be made of silicon oxide (SiOx) or silicon nitride (SiNx).

An active layer 214 is formed on the buffer layer 211. The active layer 214 may comprise amorphous silicon or polycrystalline silicon, which is crystallized amorphous silicon. Although not shown in the drawing, the active layer 214 may comprise a channel region, a source region, and a drain region. The source region and the drain region may be doped with P- or N-type impurities. Further, the active layer 214 may comprise an ohmic contact layer for lowering contact resistance.

A first insulating layer 213 is formed on the active layer 214. The first insulating layer 213 may be a single layer of silicon oxide (SiOx) or silicon nitride (SiNx), or a multilayer thereof, but is not limited thereto.

A gate 212 is formed on the first insulating layer 213. The gate 212 may be made of one selected from the group consisting of molybdenum (Mo), aluminum (Al), chrome (Cr), gold (Au), titanium (Ti), nickel (Ni), neodymium (Nd), and copper (Cu), or an alloy thereof. Further, the gate 212 may be either a single layer of one selected from the group consisting of molybdenum (Mo), aluminum (Al), chrome (Cr), gold (Au), titanium (Ti), nickel (Ni), neodymium (Nd), and copper (Cu), or a multilayer made of an alloy thereof. Alternatively, the gate 212 may be a dual layer made of Mo/Al—Nd or Mo/Al.

A second insulating layer 216a is formed on the first insulating layer 213 in such a way as to cover the gate 212. The second insulating layer 216a may be a single layer of silicon oxide (SiOx) or silicon nitride (SiNx), or a multilayer thereof, but is not limited thereto. The second insulating layer 216a may be a passivation layer.

A source 215a and a drain 215b, respectively coming into contact with the source and drain regions of the active layer 214, are formed on the second insulating layer 216a. The source 215a and the drain 215b may be formed of a single layer or a multilayer. When the source 215a and the drain 215b are formed of a single layer, they may be made of any one selected from the group consisting of molybdenum (Mo), aluminum (Al), chrome (Cr), gold (Au), titanium (Ti), nickel (Ni), neodymium (Nd), and copper (Cu), or an alloy thereof. When the source 215a and the drain 215b are formed of a multilayer, they may be formed of a dual layer of Mo/Al—Nd or a triple layer of Mo/Al/Mo or Mo/Al—Nd/Mo.

A third insulating layer 216b is formed on the source 215a and the drain 215b. The third insulating layer 216b may be a single layer of silicon oxide (SiOx) or silicon nitride (SiNx), or a multilayer thereof, but is not limited thereto. The third insulating layer 216b may be a polishing layer for increasing the degree of flatness of a surface. The above-described transistor has been illustrated to aid in understanding the embodiment, but may have a different structure according to a mask process.

Figure 21:
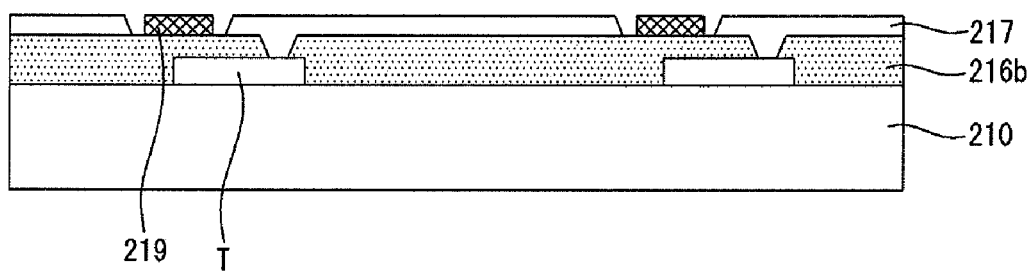

Referring to FIG. 21, a lower electrode 217 is coupled to the source 215a or the drain 215b of the transistor T. In other words, the lower electrode 217 is formed on the third insulating layer 216b so that it is coupled to the source 215a or the drain 215b of the transistor T. In this embodiment, the lower electrode 217 may be selected as a cathode. The lower electrode 217 selected as a cathode may be made of Al, AlNd, or Ag and formed thickly in order to increase reflectance.

Figure 22:
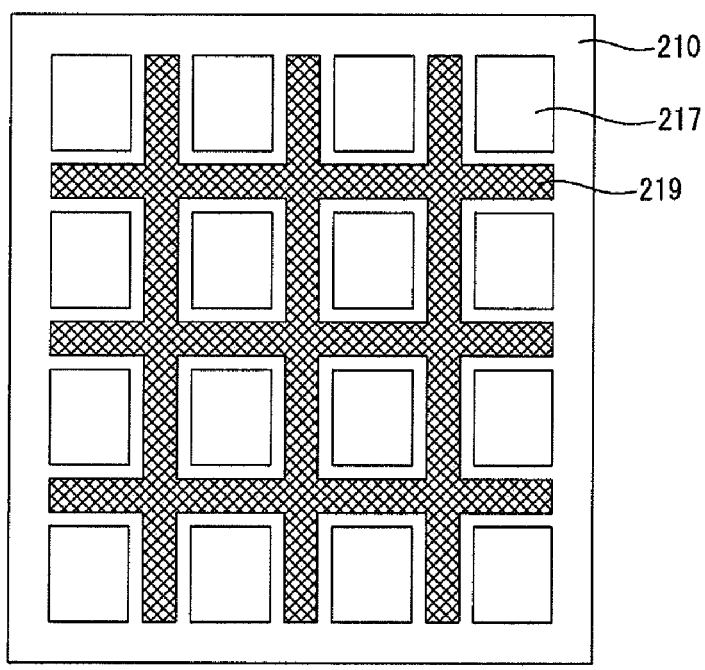
Figure 23:
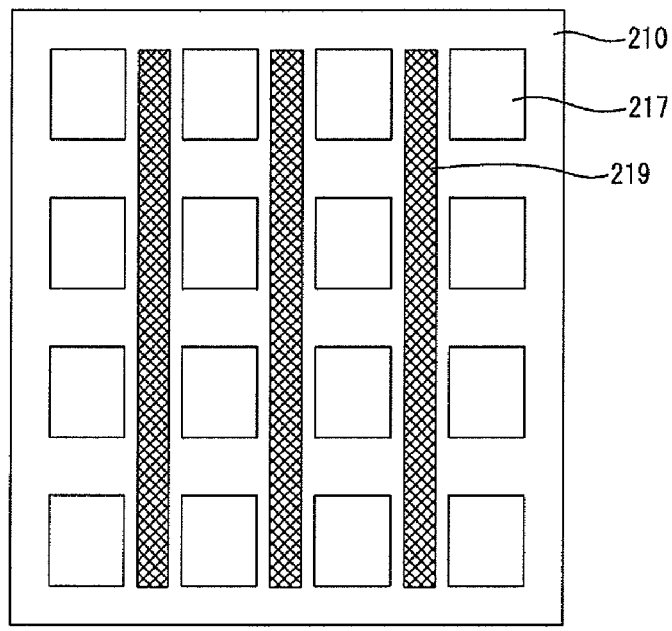

Referring to FIG. 21, a bus electrode 219 separated from the lower electrode 217 is formed on the same layer as the lower electrode 217. The bus electrode 219 may have a single layer structure or a multilayer structure made of at least one of molybdenum (Mo), aluminum (Al), chrome (Cr), gold (Au), titanium (Ti), nickel (Ni), neodymium (Nd), and copper (Cu). Meanwhile, the bus electrode 219 may be formed in a mesh (refer to FIG. 22) or stripes (refer to FIG. 23), but is not limited thereto.

Figure 24:
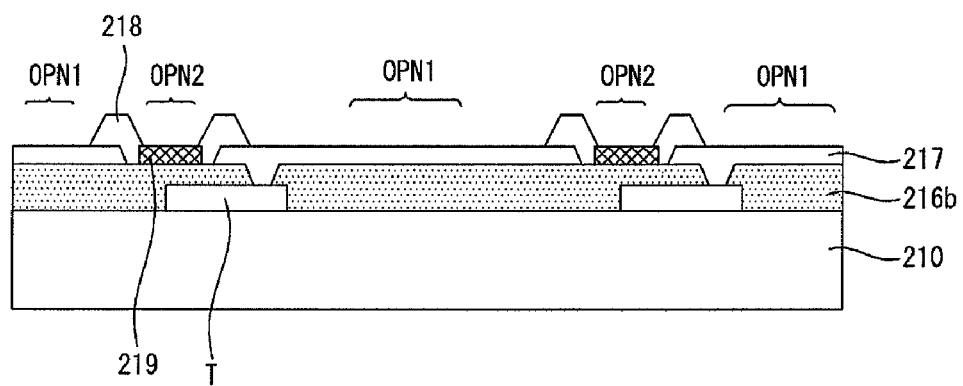

Referring to FIG. 24, a bank layer 218 is formed. The bank layer 218 comprises openings OPN1 and OPN2 through which the lower electrode 217 and the bus electrode 219 are respectively exposed. The bank layer 218 may comprise an organic material, such as benzocyclobutene (BCB) resin, acrylic resin, or polyimide resin, but is not limited thereto. Since the openings OPN1 through which part of the lower electrode 217 is exposed are formed when the bank layer 218 is formed, the light-emitting region of the subpixel can be defined and, at the same time, the openings OPN2 through which the bus electrode 219 is exposed can be formed.

Figure 25:
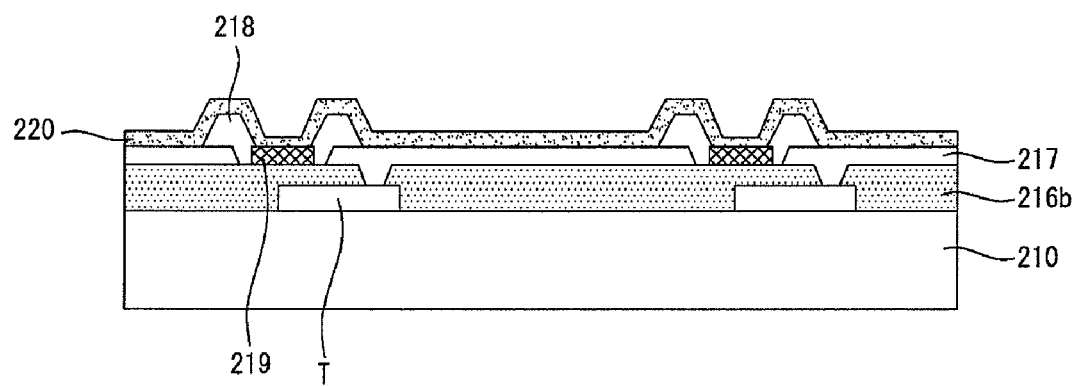
Figure 26:
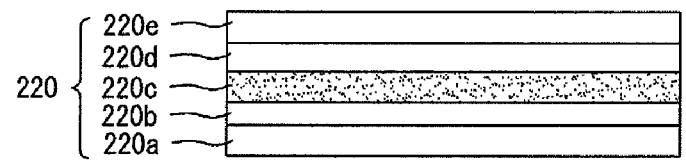

Referring to FIG. 25, an organic light-emitting layer 220 is formed to cover the lower electrode 217, the bank layer 218, and the bus electrode 219. The organic light-emitting layer 220 is formed so that it covers the lower electrode 217, the bank layer 218, and the bus electrode 219 formed on the substrate 210. Referring to FIG. 26, the organic light-emitting layer 220 may comprise an electron injection layer 220a, an electron transport layer 220b, an emission layer 220c, a hole transport layer 220d, and a hole injection layer 220e.

Figure 27:
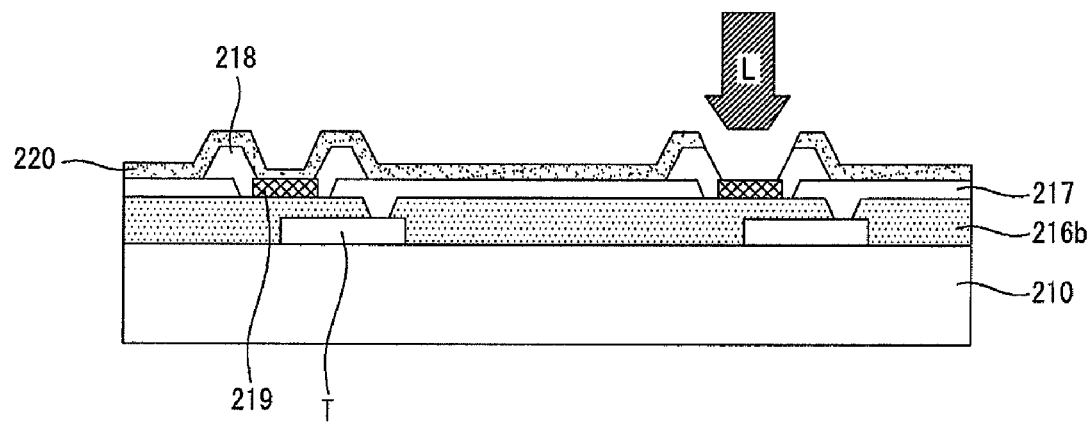
Figure 28:
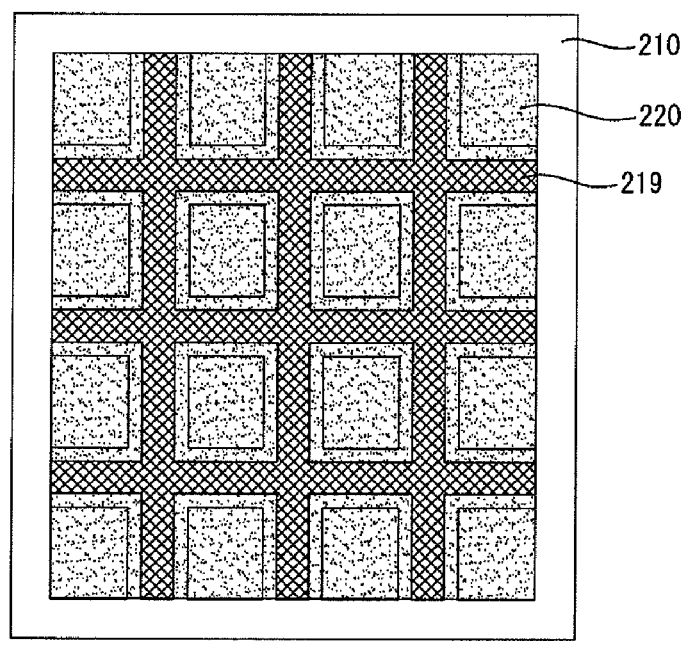
Figure 29:
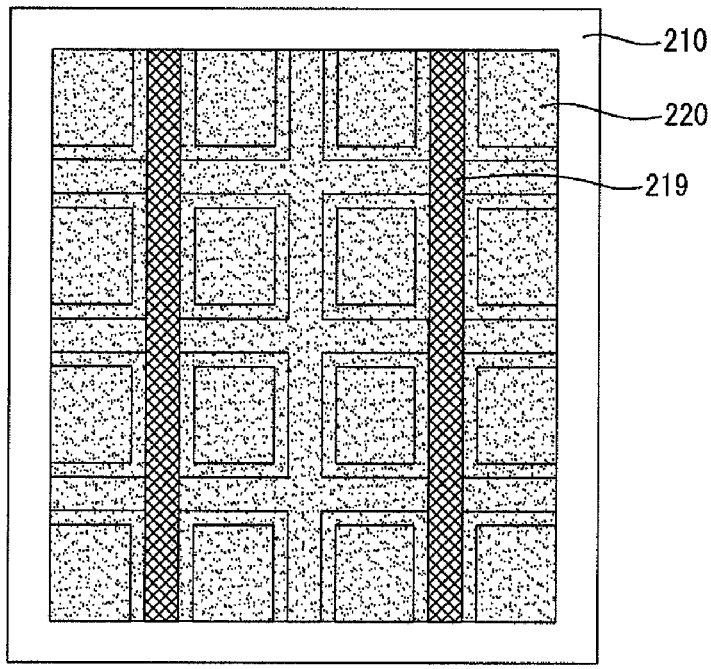

Referring to FIG. 27, the organic light-emitting layer 220 is patterned so that the bus electrode 219 placed on the bank layer 218 is exposed. The organic light-emitting layer 220 is patterned using a laser L. If the organic light-emitting layer 220 is patterned using the laser L as described above, light energy emitted from the laser L is transformed into thermal energy, so a boundary portion of the organic light-emitting layer 220 and the bus electrode 219 is sublimated. Meanwhile, when the organic light-emitting layer 220 is patterned using the laser L, a region where the bus electrode 219 is formed may be fully patterned (refer to FIG. 28) or locally patterned (refer to FIG. 29).

Figure 30:
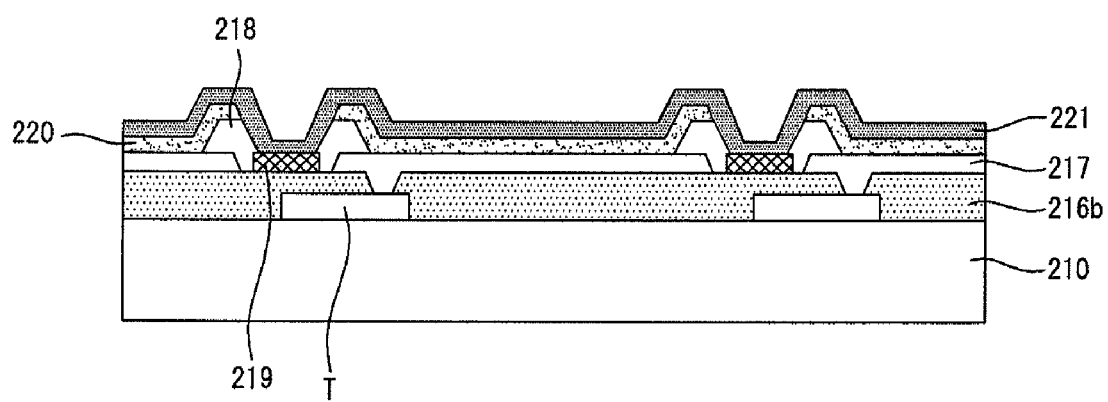

Referring to FIG. 30, an upper electrode 221 is formed on the organic light-emitting layer 220 so that the upper electrode 221 comes into contact with the exposed bus electrode 219. The upper electrode 221 may be selected as an anode. The upper electrode 221 selected as the anode may be made of any one of ITO, IZO, ITZO, and AZO ($Al_2O_3$ doped ZnO), but is not limited thereto.

If the top emission-type organic electroluminescent display device is manufactured using the above method, the upper electrode 221 selected as a cathode in order to increase transparency can be formed thinly. Accordingly, a problem of the organic light-emitting layer 220 being damaged by sputtering, etc. can be prevented. In particular, the resistance of the upper electrode 221 can be lowered because the bus electrode 219 and the upper electrode 221 formed on the bank layer 218 can be electrically coupled to each other without increasing a mask process. The organic electroluminescent display device having the above structure can lower a driving voltage and so solve the problem of luminance irregularity. Accordingly, problems (e.g., rise in driving voltage and luminance irregularity) occurring when a large-sized display device is implemented using an organic electroluminescent display device can be avoided.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 U.S.C. §112, sixth paragraph.

What is claimed is:

1. A method of manufacturing an organic electroluminescent display device, comprising:
   forming transistors on a substrate;
   forming an insulating layer on the transistors;
   forming a lower electrode on the insulating layer, the lower electrode being coupled to a source or a drain of each of the transistors
   forming a bank layer on the lower electrode, the bank layer having openings to expose part of the lower electrode;
   forming a bus electrode on the bank layer;
   forming an organic light-emitting layer to cover the lower electrode, the bank layer, and the bus electrode;
   patterning the organic light-emitting layer using a laser, thereby exposing at least part of the bus electrode placed on the bank layer; and
   forming an upper electrode on the organic light-emitting layer so that the upper electrode comes into contact with the exposed bus electrode.

2. The method of manufacturing an organic electroluminescent display device according to claim 1, wherein the step of forming the bus electrode further comprises forming the bus electrode in a shape of a mesh or stripes.

3. The method of manufacturing an organic electroluminescent display device according to claim 1, wherein the upper electrode has a single layer made of at least one of metal, metal oxide, and an organic conductive material or a multilayer made of at least two of metal, metal oxide, and an organic conductive material.

4. A method of manufacturing an organic electroluminescent display device, comprising:
   forming transistors on a substrate;
   forming an insulating layer on the transistors;
   forming a lower electrode on the insulating layer, the lower electrode being coupled to a source or a drain of each of the transistors;
   forming a bus electrode separated from the lower electrode and disposed on the insulating layer;
   forming a bank layer on the lower electrode, the bank layer having first openings to expose part of the lower electrode and second openings to expose at least part of the bus electrode;
   forming an organic light-emitting layer to cover the lower electrode, the bank layer, and the bus electrode;
   patterning the organic light-emitting layer using a laser, thereby exposing at least part of the bus electrode on the bank layer; and
   forming an upper electrode on the organic light-emitting layer so that the upper electrode comes into contact with the exposed bus electrode.

5. The method of manufacturing an organic electroluminescent display device according to claim 4, wherein the step of forming the bus electrode further comprises forming the bus electrode in a shape of a mesh or stripes.

6. The method of manufacturing an organic electroluminescent display device according to claim 4, wherein the upper electrode has a single layer made of at least one of metal, metal oxide, and an organic conductive material or a multilayer made of at least two of metal, metal oxide, and an organic conductive material.

* * * * *